(12) United States Patent
Taghivand et al.

(10) Patent No.: US 10,855,225 B1
(45) Date of Patent: Dec. 1, 2020

(54) RADIO FREQUENCY LOW POWER DIFFERENTIAL FREQUENCY MULTIPLIER

(71) Applicant: QUALCOMM Incorporated, San Diego, CA (US)

(72) Inventors: Mazhareddin Taghivand, Santa Clara, CA (US); Soheil Golara, Costa Mesa, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/725,682

(22) Filed: Dec. 23, 2019

(51) Int. Cl.
*H03B 19/10* (2006.01)
*H03B 19/14* (2006.01)
*H03B 5/12* (2006.01)
*H03D 7/14* (2006.01)
*H04B 1/00* (2006.01)
*H03K 5/00* (2006.01)

(52) U.S. Cl.
CPC ......... *H03B 5/1253* (2013.01); *H03B 5/1212* (2013.01); *H03B 5/1228* (2013.01); *H03B 19/10* (2013.01); *H03B 19/14* (2013.01); *H03D 7/1458* (2013.01); *H03K 5/00006* (2013.01); *H04B 1/0057* (2013.01); *H03B 2201/0225* (2013.01)

(58) Field of Classification Search
CPC ........ H03B 19/00; H03B 19/06; H03B 19/10; H03B 19/14; H03D 7/1458; H03K 5/00006
See application file for complete search history.

(56) References Cited

U.S. PATENT DOCUMENTS

| 6,239,645 | B1* | 5/2001 | Tsukahara | ............ | H03D 7/1441 327/356 |
| 2013/0187714 | A1* | 7/2013 | Ben-Yishay | ........... | H03B 19/14 330/252 |
| 2014/0184282 | A1* | 7/2014 | Chu | ........................ | H03B 19/06 327/120 |
| 2014/0361815 | A1* | 12/2014 | Depaoli | ................. | H03B 5/124 327/122 |

OTHER PUBLICATIONS

Hsieh J-Y., et al., "A Low-Power Millimeter Wave VCO by Using Frequency Doubling Technique", IEEE International Symposium on Radio-Frequency Integration Technology (RFIT), Taipei, 2016, 3 pages.
Kimura K., et al., "Frequency Mixer with a Frequency Doubler for Integrated Circuits", IEEE Journal of Solid-State Circuits, vol. 29, No. 9, Sep. 1994, pp. 1133-1137.

* cited by examiner

*Primary Examiner* — Levi Gannon
(74) *Attorney, Agent, or Firm* — Patterson + Sheridan, L.L.P.

(57) ABSTRACT

Aspects of the present disclosure provide a low power differential frequency multiplier. An example frequency multiplier circuit generally includes a first set of transistors, a second set of transistors, and a resonant circuit. The first set of transistors comprises a first transistor and a second transistor, wherein each of the transistors in the first set is a first type of transistor. The second set of transistors comprises a third transistor and a fourth transistor, wherein each of the transistors in the second set is a second type of transistor. The resonant circuit has a first terminal coupled to the first set of transistors and a second terminal coupled to the second set of transistors, wherein the resonant circuit comprises an inductive element and a capacitive element coupled in parallel with the inductive element.

20 Claims, 7 Drawing Sheets

RADIO FREQUENCY LOW POWER DIFFERENTIAL FREQUENCY MULTIPLIER

BACKGROUND

Field of the Disclosure

Certain aspects of the present disclosure generally relate to electronic circuits and, more particularly, to a low power differential frequency multiplier.

Description of Related Art

Wireless communication devices are widely deployed to provide various communication services such as telephony, video, data, messaging, broadcasts, and so on. Such wireless communication devices may transmit and/or receive radio frequency (RF) signals via any of various suitable radio access technologies (RATs) including, but not limited to, Long Term Evolution (LTE), Code Division Multiple Access (CDMA), Time Division Multiple Access (TDMA), Wideband CDMA (WCDMA), Global System for Mobility (GSM), Bluetooth, Bluetooth Low Energy (BLE), ZigBee, wireless local area network (WLAN) RATs (e.g., Wi-Fi), and the like. In certain cases, a wireless communication device may include a radio frequency transceiver for transmitting and/or receiving RF signals. The RF transceiver may include any of various suitable types of frequency multipliers.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include an improved radio frequency transceiver for a wireless communication device.

Certain aspects of the present disclosure provide a frequency multiplier circuit. The frequency multiplier circuit generally includes a first set of transistors, a second set of transistors, and a resonant circuit. The first set of transistors comprises a first transistor and a second transistor, wherein each of the transistors in the first set is a first type of transistor. The second set of transistors comprises a third transistor and a fourth transistor, wherein each of the transistors in the second set is a second type of transistor. The resonant circuit has a first terminal coupled to the first set of transistors and a second terminal coupled to the second set of transistors, wherein the resonant circuit comprises an inductive element and a capacitive element coupled in parallel with the inductive element.

Certain aspects of the present disclosure provide a radio frequency transceiver circuit. The radio frequency transceiver circuit generally includes the frequency multiplier circuit described above and a phase-locked loop having a variable-frequency oscillator, wherein differential inputs of the frequency multiplier circuit are coupled to differential outputs of the variable-frequency oscillator.

Certain aspects of the present disclosure provide a radio frequency transceiver circuit. The radio frequency transceiver circuit generally includes the frequency multiplier circuit described above and a filter having differential inputs coupled to differential outputs of the frequency multiplier circuit.

Certain aspects of the present disclosure provide a method of frequency multiplying. The method generally includes receiving a differential input signal having a first frequency at a frequency multiplier circuit and generating, with the frequency multiplier circuit, a differential output signal at a second frequency that is an integer multiple of the first frequency. The frequency multiplier circuit generally includes a first set of transistors comprising a first transistor and a second transistor, wherein each of the transistors in the first set is a first type of transistor; a second set of transistors comprising a third transistor and a fourth transistor, wherein each of the transistors in the second set is a second type of transistor; and a resonant circuit having a first terminal coupled to the first set of transistors and a second terminal coupled to the second set of transistors, wherein the resonant circuit comprises an inductive element and a capacitive element coupled in parallel with the inductive element.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
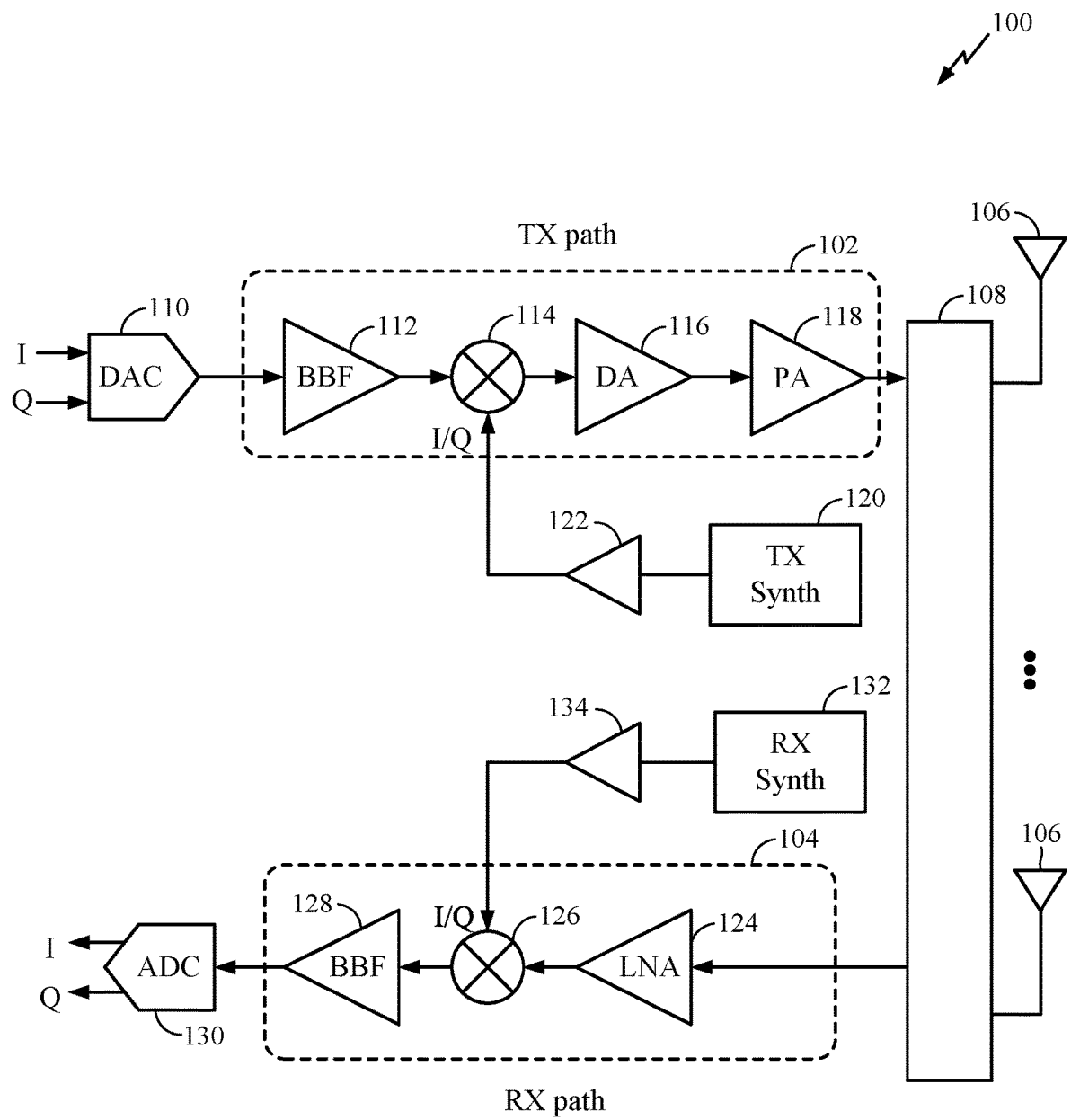
FIG. 1 is a block diagram showing an example radio frequency transceiver, in accordance with certain aspects of the present disclosure.

An RF transceiver circuit typically includes a mixer (e.g., in a zero-intermediate frequency radio architecture) that is driven by a local oscillator (LO) such as a frequency synthesizer. Various LOs (such as two coupled voltage-controlled oscillators (VCOs), a VCO with a polyphase filter, a VCO with a frequency divider, a VCO driving a frequency divider and a mixer coupled to another frequency divider) may suffer from excessive circuit area due to inductive elements or several complementary metal-oxide-semiconductor (CMOS) circuits, high power amplifier (PA) pulling (e.g., when the power of the PA output modulates the transmit-side LO through various means such as inductive, capacitive, and/or substrate coupling), high phase noise, intermodulation distortions (e.g., spurs), and/or high power consumption. Each of these LO characteristics may degrade the performance of the RF transceiver circuit. For example, an LO with high power consumption may not facilitate a power efficient RF transceiver, which may excessively drain the battery of portable wireless communication devices, such as a smartphone, tablet, or laptop. In other cases, an LO with high PA pulling may degrade the signal-to-noise ratio (SNR) of the transceiver.

Certain aspects of the present disclosure generally relate to a frequency multiplier that has low power consumption and is not susceptible to PA pulling when implemented as part of a frequency synthesizer of an RF transceiver, as further described herein. As an example, the frequency multiplier may have an LC resonant circuit coupled between n-channel and p-channel transistor pairs with a common-mode feedback amplifier that biases a transistor coupled to the LC resonant circuit such that the input voltage of the common-mode feedback amplifier matches a reference voltage. Because the inductor of the LC resonant circuit appears as a short to a direct current signal, the bias voltages across the terminals of the inductor are the same. With a differential input signal of the frequency multiplier at a fundamental frequency of $f_0$, the n-channel and p-channel transistor pairs may serve as a voltage rectifier that rectifies the input signal. The rectified signal appears as a differential voltage across the LC resonant circuit, which may be tuned, for example, at twice the frequency of the input signal ($2f_0$). Therefore, all other harmonics of the fundamental frequency $f_0$ may be rejected, which reduces the effects of PA pulling. Because of the filtering of the LC resonant circuit, the differential voltage across the LC resonant circuit may be a sinusoidal signal having a frequency of $2f_0$. In certain aspects, the frequency multiplier described herein is capable of operating at low currents such as 300 µA and a low supply voltage of 800 mV to 850 mV.

In other aspects, an RF transceiver circuit may include a mixer driven by a frequency synthesizer with the frequency multiplier described herein. For example, the frequency synthesizer may drive the frequency multiplier, which in certain aspects may be configured as a frequency doubler. As used herein, a "frequency doubler" refers to a frequency multiplier that generates an output signal having an output frequency at a second harmonic (e.g., double) of an input signal. In-phase (I) and quadrature (Q) components may be generated (e.g., by a polyphase filter) from the frequency-multiplied signal generated by the frequency multiplier, and these I and Q components may be buffered and/or amplified and provide the LO signals that drive a mixer in an RF transceiver circuit as further described herein. In other aspects, the generated I and Q components may directly drive the mixer without buffering or amplifying.

Example RF Transceiver

FIG. 1 is a block diagram of an example RF transceiver circuit 100, in accordance with certain aspects of the present disclosure. The RF transceiver circuit 100 may include a low power differential frequency multiplier as further described herein, for example, with respect to FIGS. 2 and 3. In certain aspects, the RF transceiver circuit 100 may include an RF front-end.

The RF transceiver circuit 100 includes at least one transmit (TX) path 102 (also known as a transmit chain) for transmitting signals via one or more antennas 106 and at least one receive (RX) path 104 (also known as a receive chain) for receiving signals via the antennas 106. When the TX path 102 and the RX path 104 share an antenna 106, the paths may be connected with the antenna via an interface 108, which may include any of various suitable RF devices, such as a switch, a duplexer, a diplexer, a multiplexer, and the like.

Receiving in-phase (I) or quadrature (Q) baseband analog signals from a digital-to-analog converter (DAC) 110, the TX path 102 may include a baseband filter (BBF) 112, a mixer 114, a driver amplifier (DA) 116, and a power amplifier (PA) 118. The BBF 112, the mixer 114, the DA 116, and the PA 118 may be included in a radio frequency integrated circuit (RFIC).

The BBF 112 filters the baseband signals received from the DAC 110, and the mixer 114 mixes the filtered baseband signals with a transmit local oscillator (LO) signal to convert the baseband signal of interest to a different frequency (e.g., upconvert from baseband to a radio frequency). This frequency conversion process produces the sum and difference frequencies between the LO frequency and the frequencies of the baseband signal of interest. The sum and difference frequencies are referred to as the beat frequencies. The beat frequencies are typically in the RF range, such that the signals output by the mixer 114 are typically RF signals, which may be amplified by the DA 116 and/or by the PA 118 before transmission by the antenna 106.

The RX path 104 may include a low noise amplifier (LNA) 124, a mixer 126, and a baseband filter (BBF) 128. The LNA 124, the mixer 126, and the BBF 128 may be included in a RFIC, which may or may not be the same RFIC that includes the TX path components. RF signals received via the antenna 106 may be amplified by the LNA 124, and the mixer 126 mixes the amplified RF signals with a receive local oscillator (LO) signal to convert the RF signal of interest to a different baseband frequency (e.g., downconvert). The baseband signals output by the mixer 126 may be filtered by the BBF 128 before being converted by an analog-to-digital converter (ADC) 130 to digital I or Q signals for digital signal processing.

Certain transceivers may employ frequency synthesizers with a variable-frequency oscillator (e.g., a voltage-controlled oscillator (VCO) or a digitally controlled oscillator (DCO)) to generate a stable, tunable LO with a particular tuning range. Thus, the transmit LO may be produced by a TX frequency synthesizer 120, which may be buffered or amplified by amplifier 122 before being mixed with the baseband signals in the mixer 114. Similarly, the receive LO may be produced by an RX frequency synthesizer 132, which may be buffered or amplified by amplifier 134 before being mixed with the RF signals in the mixer 126. For certain aspects, a single frequency synthesizer may be used for both the TX path 102 and the RX path 104.

Figure 2:
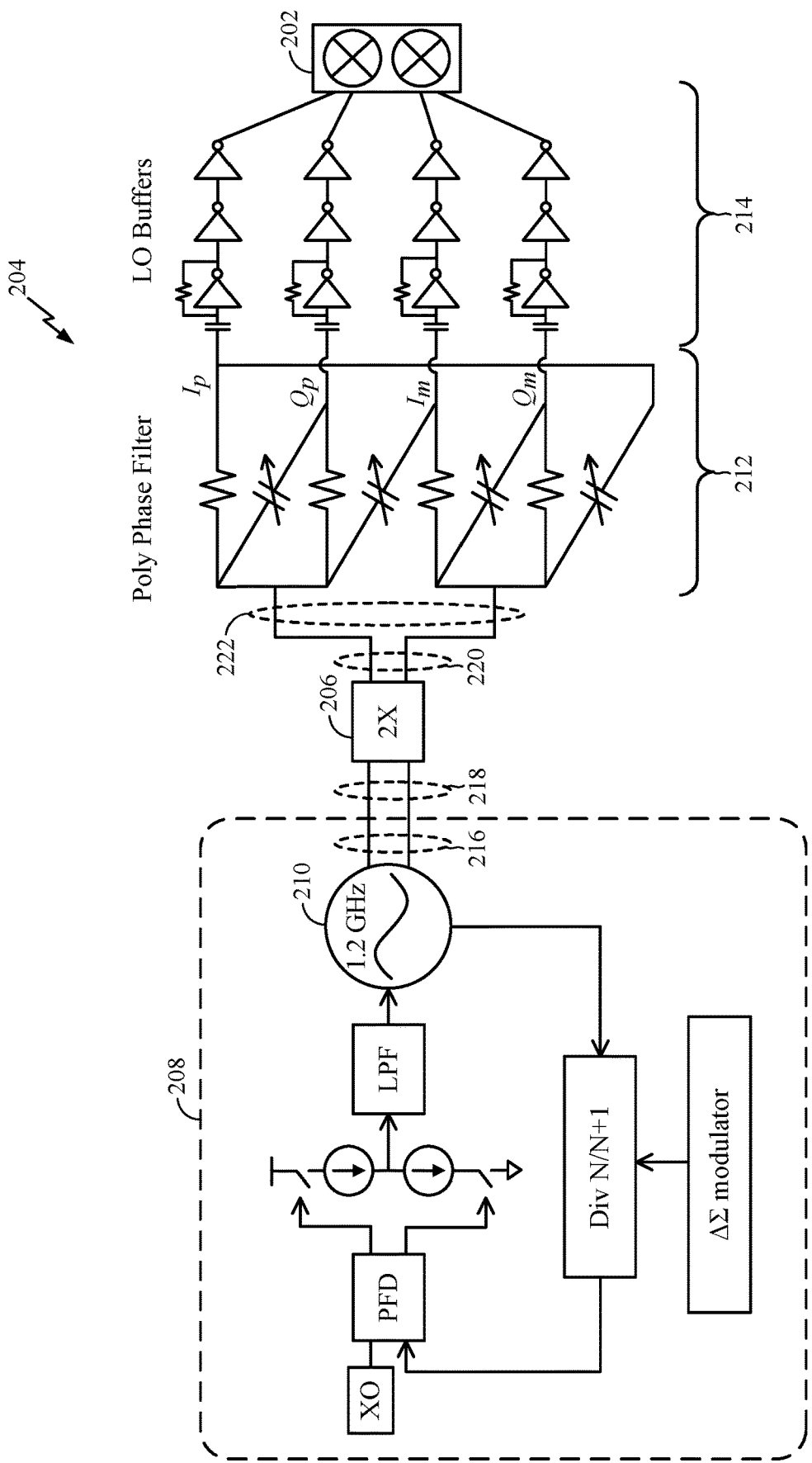
FIG. 2 is a block diagram of an example frequency synthesizer having a frequency multiplier and generating in-phase (I) and quadrature (Q) local oscillator (LO) signals for applying to mixers for frequency conversion, in accordance with certain aspects of the present disclosure.

In aspects, the TX frequency synthesizer 120 and/or RX frequency synthesizer 132 may include a frequency multiplier, such as a frequency doubler, that is driven by an oscillator (e.g., a VCO) in the frequency synthesizer. For example, FIG. 2 is a block diagram of an example frequency synthesizer 204 with a frequency multiplier 206, in accordance with certain aspects of the present disclosure. The frequency synthesizer 204 is configured to generate I and Q LO signals for applying to mixers 202 for frequency conversion. As shown, the frequency synthesizer 204 may include a phase-locked loop (PLL) 208 (e.g., a delta-sigma fractional-N PLL) with a VCO 210. In this example, the VCO 210 generates a signal at half the LO frequency (e.g., 1.2 GHz). In certain aspects, the PLL 210 may apply feedback into the fractional-N divider (Div N/N+1) from the output of the frequency multiplier 206, instead of from the VCO 210. In such a case, the PLL frequency is no longer 1.2 GHz, but rather 2.4 GHz. At half the LO frequency, the output of the VCO 210 avoids PA pulling due to potential interference generated by the TX-path PA (e.g., PA 118) of an RF transceiver circuit.

The PLL 208 (and more specifically the output of the VCO 210) is electrically coupled to the frequency multiplier 206 and feeds an output signal to the frequency multiplier 206, which in this example is a frequency doubler that generates an output signal at a second harmonic (e.g., 2.4 GHz) of the output of the PLL 208. In aspects, differential inputs 218 of the frequency multiplier 206 are coupled to differential outputs 216 of the VCO 210. The frequency multiplier 206 may have an LC resonant circuit coupled between n-channel and p-channel transistor pairs with common-mode feedback to bias through the inductor of the LC resonant circuit, as further described herein with respect to FIG. 3. The frequency multiplier 206 outputs an oscillating signal (e.g., a sinusoidal signal) at the LO frequency to a filter 212 (e.g., a polyphase filter) that separates the output signal into differential I/Q components including $I_p$, $I_m$, $Q_p$, and $Q_m$.

The filter 212 is electrically coupled between the frequency multiplier 206 and buffers 214. In aspects, the filter 212 has differential inputs 222 coupled to differential outputs 220 of the frequency multiplier 206. The filter 212 outputs the I/Q components to the buffers 214, which feed the buffered I/Q components to the I/Q channel mixers 202. The buffers 214 may include at least two stages of buffers on each of the I/Q components before the mixers 202. At least one of the buffers 214 on each of the I/Q components may be implemented as an AC-coupled self-biased inverter. The buffers 214 may each output a rail-to-rail signal delivered to the mixers 202, whereas in other aspects, the buffers 214 may not have a rail-to-rail output. In the example of FIG. 2, the buffers 214 feed the I/Q components to the mixers 202 at a 50% duty cycle. Expressed another way, the buffers 214 may be configured to output differential I/Q components having a 50% duty cycle. In certain aspects, the buffers 214 may be configured to output differential I/Q components having a 25% duty cycle, as further described herein with respect to FIG. 5.

In certain aspects, the filter 212 is electrically coupled to the frequency multiplier 206 and the mixers 202, without any buffers coupled between the filter 212 and the mixers 202. That is, the filter 212 may output the I/Q components directly to the mixers 202.

While FIGS. 1 and 2 provide an RF transceiver circuit for wireless communications as an example application in which certain aspects of the present disclosure may be implemented to facilitate understanding, certain aspects described herein related to a frequency multiplier circuit may be utilized in any of various other suitable electronic systems.

Example RF Low Power Differential Frequency Multiplier

Figure 3:
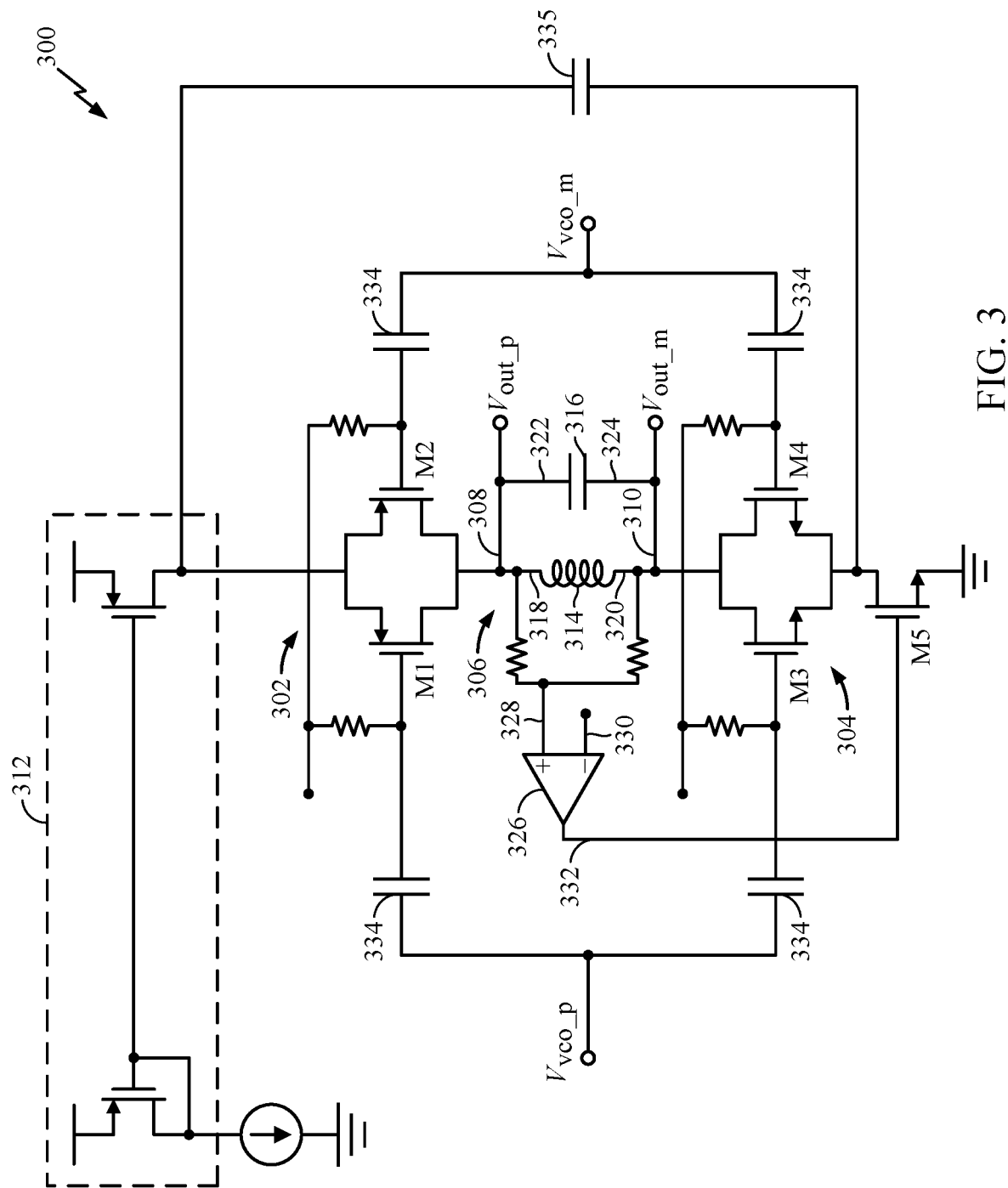
FIG. 3 is a schematic diagram of an example frequency multiplier, in accordance with certain aspects of the present disclosure.

FIG. 3 illustrates a diagram of an example frequency multiplier circuit 300, in accordance with certain aspects of the present disclosure. The frequency multiplier circuit 300 may be used as the frequency multiplier 206 in FIG. 2. The frequency multiplier circuit 300 is configured to generate a differential output signal ($V_{out\_p}$, $V_{out\_m}$) at double a frequency (e.g., a second harmonic) of a differential input signal ($V_{vco\_p}$, $V_{vco\_m}$), which may be generated by VCO, such as the VCO 210. Thus, the frequency multiplier circuit 300 may be referred to as a frequency doubler, generating a second harmonic (e.g., 2.4 GHz) of the differential input signal (e.g., 1.2 GHz). In certain cases, the frequency multiplier circuit 300 may provide an LO frequency used by a mixer in an RF transceiver circuit configured for wireless local area network (WLAN) communications, such as within the 2.4 GHz band of channels of Institute of Electrical and Electronics Engineers (IEEE) 802.11 WLAN standards. The frequency multiplier circuit 300 may be configured to operate via a power supply comprising a supply voltage of less than or equal to 850 mV or from 800 mV to 850 mV and a low supply current of less than or equal to 300 µA or from 240 µA to 310 µA. In other words, the frequency multiplier circuit 300 may enable operation at low power levels of 800 mV to 850 mV and 240 µA to 310 µA.

As shown, the frequency multiplier circuit 300 includes a first set of transistors 302, a second set of transistors 304, and a resonant circuit 306. The resonant circuit 306 includes a first terminal 308 coupled to the first set of transistors 302 and a second terminal 310 coupled to the second set of transistors 304.

The first set of transistors 302 includes a first transistor M1 and a second transistor M2, each of which is a first type of transistor (e.g., a p-channel transistor, such as a p-type metal-oxide-semiconductor (PMOS) transistor). As shown, a source of the first transistor M1 is coupled to a source of the second transistor M2, a drain of the first transistor M1 is coupled to a drain of the second transistor M2 and to the first terminal 308 of the resonant circuit 306, a gate of the first transistor M1 is AC-coupled to a first input $V_{vco\_p}$ of a differential input signal pair of the frequency multiplier circuit 300, and a gate of the second transistor M2 is AC-coupled to a second input $V_{vco\_m}$ of the differential input signal pair of the frequency multiplier circuit 300. In aspects, AC-coupling capacitors 334 may be electrically coupled between the gate of the first transistor M1 and the first input $V_{vco\_p}$ of the differential input signal and between the gate of the second transistor M2 and the second input $V_{vco\_m}$ of the differential input signal.

The second set of transistors 304 includes a third transistor M3 and a fourth transistor M4, each of which is a second type of transistor (e.g., an n-channel transistor, such as an n-type metal-oxide-semiconductor (NMOS) transistor). A source of the third transistor M3 is coupled to a source of the fourth transistor M4, a drain of the third transistor M3 is coupled to a drain of the fourth transistor M4 and to the second terminal 310 of the resonant circuit 306, a gate of the third transistor M3 is AC-coupled to the first input $V_{vco\_p}$ of the differential input signal pair, and a gate of the fourth transistor M4 is AC-coupled to the second input $V_{vco\_m}$ of the differential input signal pair. In aspects, AC-coupling capacitors 334 may be electrically coupled between the gate of the third transistor M3 and the first input $V_{vco\_p}$ of the differential input signal and between the gate of the fourth transistor M4 and the second input $V_{vco\_m}$ of the differential input signal.

The resonant circuit 306 is configured as a filter that has a bandpass frequency response in which the bandpass may include a certain harmonic (e.g., a second harmonic) of the input signal ($V_{vco\_p}$, $V_{vco\_m}$), such that the differential output signal ($V_{out\_p}$, $V_{out\_m}$) of the frequency multiplier circuit 300 is generated across the resonant circuit 306. In aspects, the resonant circuit 306 may be a band-pass filter or a low-pass filter. The resonant circuit 306 may be an LC resonator (e.g., an LC tank) having a resonant frequency, for example, within the 2.4 GHz band of WLAN channels. The resonant circuit 306 includes an inductive element 314 and a capacitive element 316 coupled in parallel with the inductive element 314. The inductive element 314 may be an inductor, for example, having an inductance of about 18 nH. The capacitive element 316 may be a capacitor including, for example, a variable or tunable capacitor, a multilayer ceramic capacitor (MLCC), a metal-insulator-semiconductor (MIS) capacitor, or a metal-oxide-semiconductor (MOS) capacitor.

A first terminal 318 of the inductive element 314 and a first terminal 322 of the capacitive element 316 are coupled to the first set of transistors 302, and a second terminal 320 of the inductive element 314 and a second terminal 324 of the capacitive element 316 are coupled to the second set of transistors 304.

As the first differential input signal component $V_{vco\_p}$ is essentially 180° out of phase from the second differential input signal component $V_{vco\_m}$, the first and second sets of transistors 302, 304 may drive the resonant circuit 306 at the second harmonic of the differential input signal. As an example, when the first differential input signal component $V_{vco\_p}$ goes high and the second differential input signal component $V_{vco\_m}$ goes low, the first transistor M1 is in an open state (e.g., a high impedance between the source and drain), the second transistor M2 is in a closed state allowing current to flow from the source to the drain of the second transistor M2, the third transistor M3 is in a closed state allowing current to flow from the drain to the source of the third transistor M3, and the fourth transistor M4 is in an open state. When the first differential input signal component $V_{vco\_p}$ goes low and the second differential input signal component $V_{vco\_m}$ goes high, the first transistor M1 is in a closed state allowing current to flow from the source to the drain of the first transistor M1, the second transistor M2 is in an open state, the third transistor M3 is in an open state, and the fourth transistor M4 is in a closed state allowing current to flow from the drain to the source of the fourth transistor M4. The transistors 302 and 304 rectify the VCO signal, and the resonant circuit 306, with a certain resonant frequency (e.g., a resonant frequency that is twice the VCO frequency), filters the rectified current that flows between the transistors 302 and 304 and removes the VCO frequency and other harmonics, except a certain harmonic (e.g., the second harmonic of the VCO frequency).

In certain aspects, the frequency multiplier circuit 300 may be supplied by a current source 312, which may be implemented by a current mirror circuit as shown. The current source 312 may be coupled to a source of the first transistor M1 and a source of the second transistor M2. In aspects, a decoupling capacitor 335 may be electrically coupled between the current source 312 and the sources of the third transistor M3 and the fourth transistor M4.

According to certain aspects, the frequency multiplier circuit 300 may include a common-mode feedback amplifier 326 having a first input 328 coupled to the first and second terminals 308, 310 of the resonant circuit 306 and a second input 330 coupled to a reference voltage node. In aspects, the common-mode feedback amplifier 326 may adjust (amplify or attenuate) the common-mode signal of the differential output ($V_{out\_p}$, $V_{out\_m}$) across the resonant circuit 306. In certain aspects, the common-mode feedback amplifier 326 may dictate the common-mode signal to be equal to the voltage from the reference voltage node. An output 332 of the common-mode feedback amplifier 326 is coupled to a gate of a fifth transistor M5 (e.g., an n-channel transistor), whose drain is coupled to the sources of the third and fourth transistors M3, M4 and whose source is coupled to a reference potential node (e.g., electrical ground) for the frequency multiplier circuit 300. The output of the common-mode feedback amplifier 326 may adjust a bias current applied to the inductive element 314 by the fifth transistor M5. The gain of the common-mode feedback amplifier 326 may be adjusted to enable a stable bias to the inductive element 314.

Figure 4:
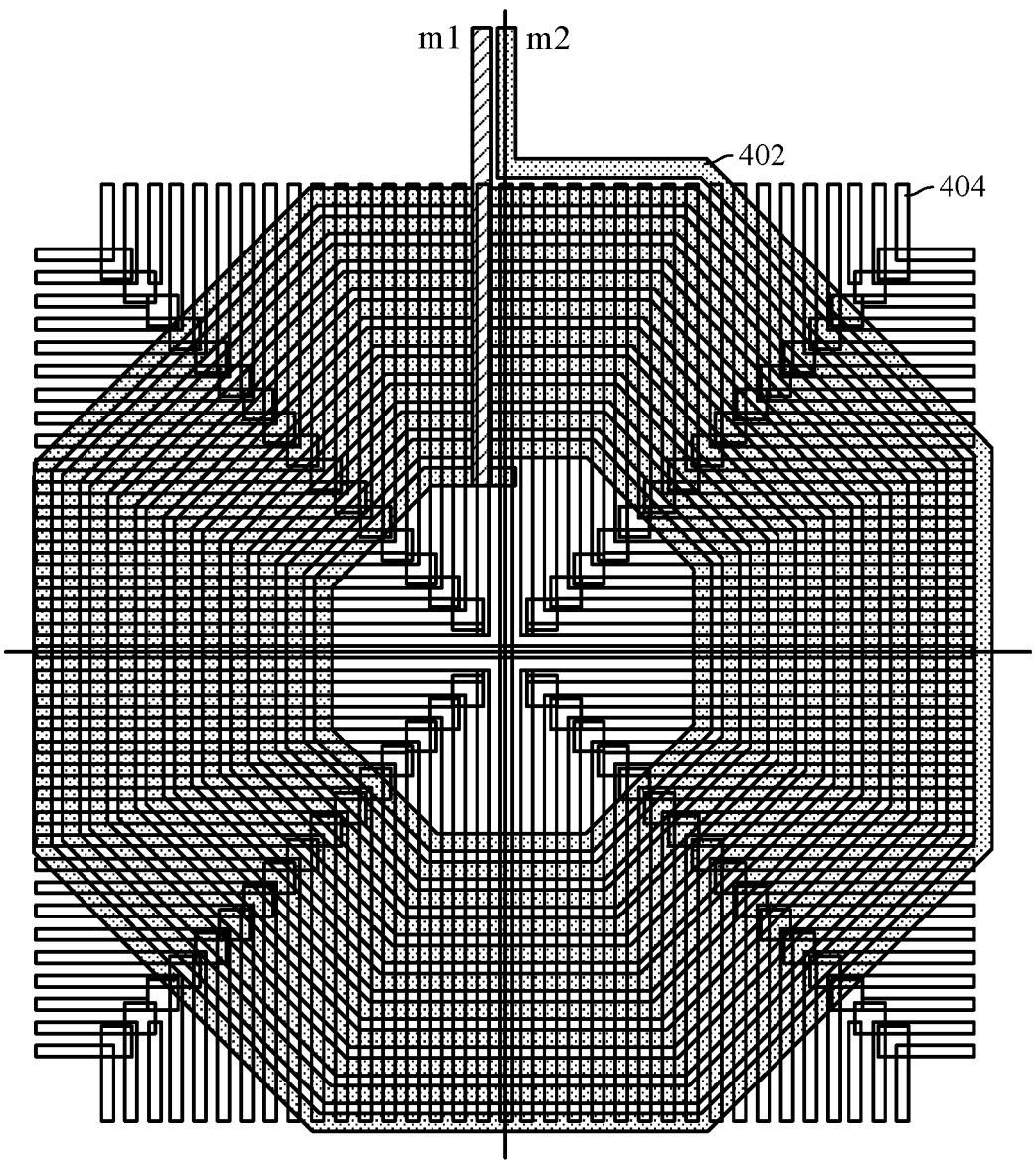
FIG. 4 illustrates a top view of an example inductor and ground shield, in accordance with certain aspects of the present disclosure.

In certain aspects, the resonant circuit may include a ground shield disposed below the inductive element (e.g., the inductive element 314) of the resonant circuit in order to facilitate an increase in a quality factor (Q) of the resonator circuit 306 and reduce substrate losses. For example, FIG. 4 illustrates a top view of an example inductive element 402 having a ground shield 404 disposed below the inductive element 402, in accordance with certain aspects of the present disclosure. In such a case, the quality factor may increase by about 30% relative to the quality factor of a resonant circuit without a ground shield. Expressed another way, the quality factor of a resonant circuit with a ground shied disposed below the inductive element may have a quality factor about 1.3 times larger than a quality factor of a resonant circuit without a ground shield for the inductive element.

Figure 5:
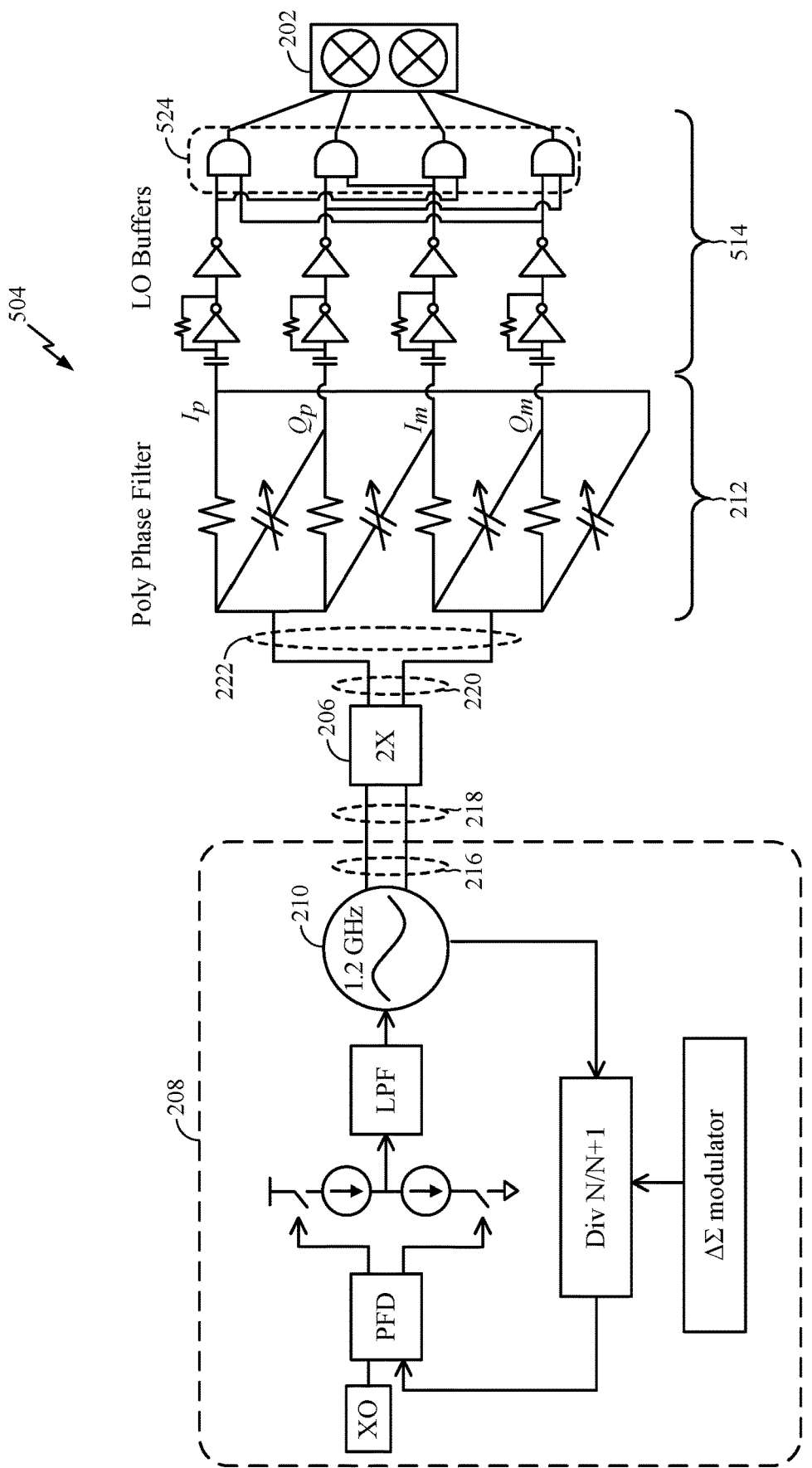
FIG. 5 is a block diagram of an example frequency synthesizer for generating 25% duty cycle I/Q LO signals, in accordance with certain aspects of the present disclosure.

According to certain aspects, the buffers coupled between the frequency synthesizer and the mixer of an RF transceiver circuit may convert the I/Q components to 25% duty cycle signals. Expressed another way, the buffers may be configured to output differential I/Q components having a 25% duty cycle. For example, FIG. 5 is a block diagram of an example frequency synthesizer 504 (similar to the frequency synthesizer 204) for generating 25% duty cycle I/Q LO signals, in accordance with certain aspects of the present disclosure. The frequency synthesizer 504 includes buffers 514 having a stage of logical AND gates 524 that convert the I/Q components to signals having a 25% duty cycle.

Figure 6:
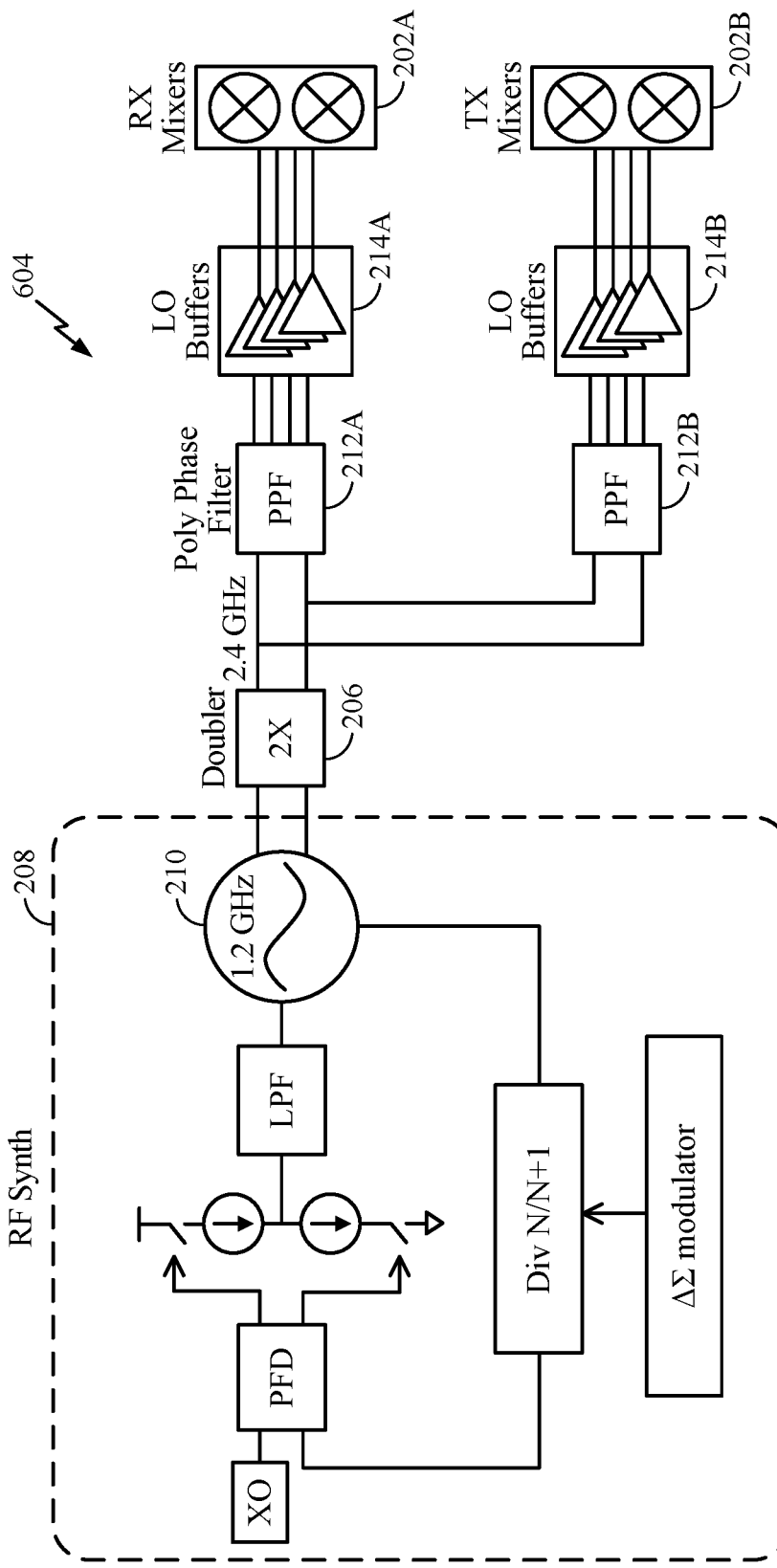
FIG. 6 is a block diagram of example transmitter and receiver mixers with I/Q LO signals generated by a single frequency synthesizer with a frequency multiplier, in accordance with certain aspects of the present disclosure.

In certain aspects, the RX and TX mixers may share the same frequency synthesizer to generate the LO frequency. That is, a single frequency synthesizer having a frequency multiplier as described herein may drive the RX and TX mixers of an RF transceiver circuit. An RF transceiver circuit having the same frequency synthesizer for the RX and TX paths may reduce its power consumption and overall circuit area. For example, FIG. 6 is a block diagram of an example frequency synthesizer 604 with the frequency multiplier 206 coupled to the RX and TX mixers 202A, 202B, respectively, in accordance with certain aspects of the present disclosure. As shown, the RX path has filters 212A, buffers 214A, and mixers 202A, which are coupled to the differential outputs of the frequency multiplier 206. The TX path has filters 212B (e.g., polyphase filters), buffers 214B, and mixers 202B, which are also coupled to the differential outputs of the frequency multiplier 206. In other aspects, the RX and TX mixers may also share the same filters (e.g., polyphase filters) and/or buffers to facilitate a further reduction in power consumption and circuit area.

Figure 7:
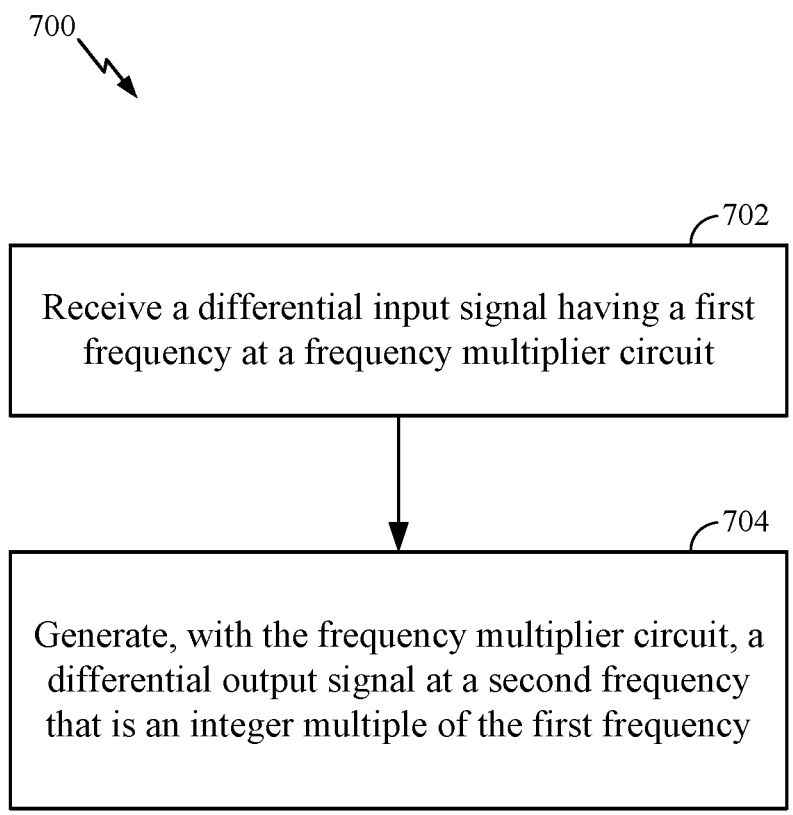
FIG. 7 is a flow diagram of example operations for multiplying a frequency of a differential input signal, in accordance with certain aspects of the present disclosure.

FIG. 7 is a flow diagram of example operations 700 for multiplying a frequency of a differential input signal, in accordance with certain aspects of the present disclosure. The operations 700 may be performed, for example, by a frequency multiplier (e.g., the frequency multiplier circuit 300).

The operations 700 may begin at block 702, where the frequency multiplier circuit receives the differential input signal having a first frequency. The frequency multiplier circuit may include a first set of transistors (e.g., the first set of transistors 302) comprising a first transistor (e.g., the first transistor M1) and a second transistor (e.g., the second transistor M2), a second set of transistors (e.g., the second set of transistors 304) comprising a third transistor (e.g., the third transistor M3) and a fourth transistor (e.g., the fourth transistor M4). Each of the transistors in the first set is a first type of transistor, and each of the transistors in the second set is a second type of transistor. For example, the first type of transistor may be a p-channel transistor, and the second type of transistor may be an n-channel transistor. The frequency multiplier circuit may also include a resonant circuit (e.g., the resonant circuit 306) having a first terminal (e.g., the first terminal 308) coupled to the first set of transistors and a second terminal (e.g., the second terminal 310) coupled to the second set of transistors. The resonant circuit includes an inductive element (e.g., the inductive element 314) and a capacitive element (e.g., the capacitive element 316) coupled in parallel with the inductive element.

At block 704, the frequency multiplier circuit generates a differential output signal at a second frequency, which is an integer multiple of the first frequency. In certain aspects, generating the output signal at block 704 comprises generating a differential output signal at double a frequency of the differential input signal, where the differential output signal is generated across the resonant circuit.

In certain aspects, the resonant circuit may operate as a filter with a second harmonic of the differential input signal in a passband of the frequency response of the filter. In certain aspects, a first terminal of the inductive element and a first terminal of the capacitive element are coupled to the first set of transistors, and a second terminal of the inductive element and a second terminal of the capacitive element are coupled to the second set of transistors.

In certain aspects, receiving the differential input signal at block 702 may include receiving a first signal component of the differential input signal with a gate of the first transistor and receiving a second signal component of the differential input signal with a gate of the second transistor. For instance, the gate of the first transistor may be AC-coupled to a first input of the frequency multiplier circuit receiving the first signal component, and the gate of the second transistor may be AC-coupled to a second input of the frequency multiplier circuit receiving the second signal component. In aspects, a source of the first transistor is coupled to a source of the second transistor, and a drain of the first transistor is coupled to a drain of the second transistor and to the first terminal of the resonant circuit.

In certain aspects, receiving the differential input signal at block 702 may include receiving the first signal component of the differential input signal with a gate of the third transistor, and receiving the second signal component of the differential input signal with a gate of the fourth transistor. For instance, the gate of the third transistor may be AC-coupled to the first input of the frequency multiplier circuit receiving the first signal component, and the gate of the fourth transistor may be AC-coupled to the second input of the frequency multiplier circuit receiving the second signal component. In aspects, a source of the third transistor is coupled to a source of the fourth transistor, and a drain of the third transistor is coupled to a drain of the fourth transistor and to the second terminal of the resonant circuit.

According to certain aspects, the operations 700 may also include adjusting a bias voltage applied to the second set of transistors with a gate of a fifth transistor (e.g., the fifth transistor M5) coupled to an output of a common-mode feedback amplifier (e.g., the common-mode feedback amplifier 326) having a first input coupled to the first and second terminals of the resonant circuit and a second input coupled to a reference voltage node. The fifth transistor may have a drain coupled to a source of the third transistor and to a source of the fourth transistor. The fifth transistor may also have a source coupled to a reference potential node (e.g., electrical ground).

In certain aspects, the operations 700 may also include supplying a current with a current source (e.g., the current source 312) coupled to a source of the first transistor and to a source of the second transistor. For example, the current source may comprise a current mirror circuit. In aspects, the frequency multiplier circuit operates via a power supply comprising a supply voltage of less than or equal to 800 mV and a supply current of less than or equal to 300 µA.

According to certain aspects, an RF transceiver circuit (e.g., the RF transceiver circuit 100) may perform various wireless communication operations with the frequency multiplier circuit of operations 700 and a phase-locked loop having a voltage-controlled oscillator (e.g., the PLL 208 and the VCO 210), where the differential inputs of the frequency multiplier circuit are coupled to differential outputs of the voltage-controlled oscillator. In aspects, the RF transceiver circuit may perform various wireless communication operations with the frequency multiplier circuit of operations 700 and a filter (e.g., the filter 212, such as a polyphase filter) having differential inputs coupled to differential outputs of the frequency multiplier circuit.

Based on the present disclosure, it should be appreciated that the frequency multiplier described herein provides various improvements to an RF transceiver circuit. In certain aspects, the frequency multiplier operates at an extremely low current, for example, from 240 µA to 310 µA, enabling an RF transceiver circuit to reduce its power consumption compared to other conventional LO designs. In aspects, the frequency multiplier described herein may not be affected by PA pulling as the differential input signal to the frequency multiplier is half of the LO frequency of a mixer, and the frequency multiplier is driven by an isolated current source.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. A frequency multiplier circuit comprising:
   a first set of transistors comprising a first transistor and a second transistor, wherein each of the transistors in the first set is a first type of transistor;
   a second set of transistors comprising a third transistor and a fourth transistor, wherein each of the transistors in the second set is a second type of transistor;
   a resonant circuit having a first terminal coupled to the first set of transistors and a second terminal coupled to the second set of transistors, wherein the resonant circuit comprises an inductive element and a capacitive element coupled in parallel with the inductive element; and
   a current source coupled to a source of the first transistor and a source of the second transistor.

2. The frequency multiplier circuit of claim 1, wherein the frequency multiplier circuit is configured to generate a differential output signal at double a frequency of a differential input signal.

3. The frequency multiplier circuit of claim 1, wherein the first type of transistor is a p-channel transistor, and the second type of transistor is an n-channel transistor.

4. The frequency multiplier circuit of claim 1, wherein:
   a source of the first transistor is coupled to a source of the second transistor;
   a drain of the first transistor is coupled to a drain of the second transistor and to the first terminal of the resonant circuit;
   a gate of the first transistor is coupled to a first input of a differential input signal pair of the frequency multiplier circuit; and
   a gate of the second transistor is coupled to a second input of the differential input signal pair of the frequency multiplier circuit.

5. The frequency multiplier circuit of claim 4, wherein:
   a source of the third transistor is coupled to a source of the fourth transistor,
   a drain of the third transistor is coupled to a drain of the fourth transistor and to the second terminal of the resonant circuit,
   a gate of the third transistor is coupled to the first input of the differential input signal pair, and
   a gate of the fourth transistor is coupled to the second input of the differential input signal pair.

6. The frequency multiplier circuit of claim 5, wherein:
   the gate of the first transistor is AC-coupled to the first input of the differential input signal pair;
   the gate of the second transistor is AC-coupled to the second input of the differential input signal pair;
   the gate of the third transistor is AC-coupled to the first input of the differential input signal pair; and
   the gate of the fourth transistor is AC-coupled to the second input of the differential input signal pair.

7. The frequency multiplier circuit of claim 1, wherein:
   a first terminal of the inductive element and a first terminal of the capacitive element are coupled to the first set of transistors; and
   a second terminal of the inductive element and a second terminal of the capacitive element are coupled to the second set of transistors.

8. The frequency multiplier circuit of claim 1, wherein the resonant circuit is configured as a filter with a second harmonic of an input signal to the frequency multiplier circuit in a passband of the filter.

9. The frequency multiplier circuit of claim 1, further comprising a common-mode feedback amplifier having a first input coupled to the first and second terminals of the resonant circuit and a second input coupled to a reference voltage node.

10. The frequency multiplier circuit of claim 9, further comprising a fifth transistor having a gate coupled to an output of the common-mode feedback amplifier, having a drain coupled to a source of the third transistor and to a source of the fourth transistor, and having a source coupled to a reference potential node.

11. The frequency multiplier circuit of claim 1, wherein the current source comprises a current mirror circuit.

12. The frequency multiplier circuit of claim 1, wherein the frequency multiplier circuit is configured to operate via a power supply comprising a supply voltage of less than or equal to 800 mV and a supply current of less than or equal to 300 µA.

13. A radio frequency transceiver circuit comprising the frequency multiplier circuit of claim 1 and a phase-locked loop having a variable-frequency oscillator, wherein differential inputs of the frequency multiplier circuit are coupled to differential outputs of the variable-frequency oscillator.

14. A radio frequency transceiver circuit comprising the frequency multiplier circuit of claim 1 and a filter having differential inputs coupled to differential outputs of the frequency multiplier circuit.

15. A method of frequency multiplying, comprising:
receiving a differential input signal having a first frequency at a frequency multiplier circuit comprising:
a first set of transistors comprising a first transistor and a second transistor, wherein each of the transistors in the first set is a first type of transistor;
a second set of transistors comprising a third transistor and a fourth transistor, wherein each of the transistors in the second set is a second type of transistor; and
a resonant circuit having a first terminal coupled to the first set of transistors and a second terminal coupled to the second set of transistors, wherein the resonant circuit comprises an inductive element and a capacitive element coupled in parallel with the inductive element;
supplying a current with a current source coupled to a source of the first transistor and a source of the second transistor; and
generating, with the frequency multiplier circuit, a differential output signal at a second frequency that is an integer multiple of the first frequency.

16. The method of claim 15, wherein:
receiving the differential input signal comprises:
receiving a first signal component of the differential input signal with a gate of the first transistor, and
receiving a second signal component of the differential input signal with a gate of the second transistor;
a source of the first transistor is coupled to a source of the second transistor; and
a drain of the first transistor is coupled to a drain of the second transistor and to the first terminal of the resonant circuit.

17. The method of claim 16, wherein:
receiving the differential input signal further comprises:
receiving the first signal component of the differential input signal with a gate of the third transistor, and
receiving the second signal component of the differential input signal with a gate of the fourth transistor;
a source of the third transistor is coupled to a source of the fourth transistor; and
a drain of the third transistor is coupled to a drain of the fourth transistor and to the second terminal of the resonant circuit.

18. The method of claim 15, wherein the first type of transistor is a p-channel transistor, and wherein the second type of transistor is an n-channel transistor.

19. The method of claim 15, further comprising adjusting a bias voltage applied to the second set of transistors with a gate of a fifth transistor coupled to an output of a common-mode feedback amplifier having a first input coupled to the first and second terminals of the resonant circuit and a second input coupled to a reference voltage node, the fifth transistor having a drain coupled to a source of the third transistor and to a source of the fourth transistor and having a source coupled to a reference potential node.

20. A method of frequency multiplying, comprising:
receiving a differential input signal having a first frequency at a frequency multiplier circuit comprising:
a first set of transistors comprising a first transistor and a second transistor, wherein each of the transistors in the first set is a first type of transistor;
a second set of transistors comprising a third transistor and a fourth transistor, wherein each of the transistors in the second set is a second type of transistor; and
a resonant circuit having a first terminal coupled to the first set of transistors and a second terminal coupled to the second set of transistors, wherein the resonant circuit comprises an inductive element and a capacitive element coupled in parallel with the inductive element;
generating, with the frequency multiplier circuit, a differential output signal at a second frequency that is an integer multiple of the first frequency; and
adjusting a bias voltage applied to the second set of transistors with a gate of a fifth transistor coupled to an output of a common-mode feedback amplifier having a first input coupled to the first and second terminals of the resonant circuit and a second input coupled to a reference voltage node, the fifth transistor having a drain coupled to a source of the third transistor and to a source of the fourth transistor and having a source coupled to a reference potential node.

* * * * *